United States Patent
Kim et al.

(10) Patent No.: US 9,194,036 B2
(45) Date of Patent: Nov. 24, 2015

(54) PLASMA VAPOR DEPOSITION

(75) Inventors: Sun-Oo Kim, Hopewell Junction, NY (US); Moosung Chae, Poughkeepsie, NY (US); Bum Ki Moon, LaGrangeville, NY (US)

(73) Assignee: Infineon Technologies AG, Neubiberg (DE)

( * ) Notice: Subject to any disclaimer, the term of this patent is extended or adjusted under 35 U.S.C. 154(b) by 1442 days.

(21) Appl. No.: 11/851,269

(22) Filed: Sep. 6, 2007

(65) Prior Publication Data
US 2009/0065349 A1 Mar. 12, 2009

(51) Int. Cl.
*C23C 14/34* (2006.01)
*H01J 37/34* (2006.01)

(52) U.S. Cl.
CPC ......... *C23C 14/3464* (2013.01); *C23C 14/3407* (2013.01); *C23C 14/3471* (2013.01); *H01J 37/34* (2013.01); *H01J 37/3414* (2013.01); *H01J 37/3417* (2013.01); *H01J 37/3423* (2013.01)

(58) Field of Classification Search
CPC .......................... H01J 37/3414; H01J 37/3417
USPC ............. 204/298.12, 298.06, 298.26, 192.12, 204/192.15
See application file for complete search history.

(56) References Cited

U.S. PATENT DOCUMENTS

| | | | |
|---|---|---|---|
| 4,426,275 A * | 1/1984 | Meckel et al. | 204/298.06 |
| 4,596,645 A * | 6/1986 | Stirn | 204/192.25 |
| 5,069,770 A | 12/1991 | Glocker | |
| 5,482,611 A | 1/1996 | Helmer et al. | |
| 5,556,525 A * | 9/1996 | Krivokapic et al. | 204/192.12 |
| 5,643,428 A * | 7/1997 | Krivokapic et al. | 204/298.11 |
| 5,685,960 A * | 11/1997 | Fu et al. | 204/192.3 |
| 6,217,716 B1 | 4/2001 | Fai Lai | |
| 6,506,290 B1 * | 1/2003 | Ono | 204/298.11 |
| 6,752,912 B1 * | 6/2004 | Sandhu | 204/192.15 |
| 2002/0000374 A1 * | 1/2002 | Buchanan et al. | 204/298.26 |

FOREIGN PATENT DOCUMENTS

FR 2426093 A * 1/1980

OTHER PUBLICATIONS

Machine Translation of FR 2426093 A Jan. 18, 1980 to Cohensolal.*

* cited by examiner

*Primary Examiner* — Jason M Berman
(74) *Attorney, Agent, or Firm* — Slater & Matsil, L.L.P.

(57) ABSTRACT

A plasma vapor deposition system is described for forming a feature on a semiconductor wafer. The plasma vapor deposition comprises a primary target electrode and a plurality of secondary target electrodes. The deposition is performed by sputtering atoms off the primary and secondary target electrodes.

46 Claims, 9 Drawing Sheets

US 9,194,036 B2

PLASMA VAPOR DEPOSITION

TECHNICAL FIELD

The present invention relates generally to the manufacture of semiconductor devices, and more particularly to plasma vapor deposition systems and methods of manufacturing semiconductor devices using plasma vapor deposition systems.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Success of the semiconductor industry requires delivering higher performance at lower cost. Consequently, maintaining production costs within reasonable levels is one of the primary challenges in semiconductor manufacturing.

Improving product quality is another challenge in manufacturing semiconductor devices. For example, depositing thin films involves the challenge of maintaining a uniform deposition rate (both across wafer and within wafer) along with directional deposition for filling high aspect ratio (ratio of depth of feature to the feature's width) features such as vias and trenches. As feature sizes are continually scaled along with wafer size, there exists a continuous need to improve film deposition techniques.

Deposition equipments thus need to reduce production cost, for example, lower processing time (or increase through put) and lower down time (or maintenance time), but at the same time improve product quality. Continued success of the semiconductor industry requires overcoming these and other limitations.

SUMMARY OF THE INVENTION

In various embodiments, the current invention describes the fabrication of an integrated circuit using a plasma vapor deposition system, the plasma vapor deposition system comprising a top target electrode and a bottom electrode disposed in a plasma chamber, a workpiece holder disposed over the bottom electrode and at least one auxiliary target electrode comprising a plurality of openings disposed in the plasma chamber between the top target electrode and the bottom electrode.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a-1b illustrate a plasma vapor deposition system in accordance with an embodiment of the invention, wherein FIG. 1a illustrates the apparatus and FIG. 1b illustrates the key mechanisms of the deposition process;

FIGS. 5a-5b illustrate cross sectional views of an embodiment illustrating the use of the auxiliary target electrode in a plasma vapor deposition system with a concave target electrode, wherein FIG. 5a illustrates the plasma vapor deposition system and FIG. 5b illustrates the top cross sectional view of the auxiliary target electrode;

Figure 1A:
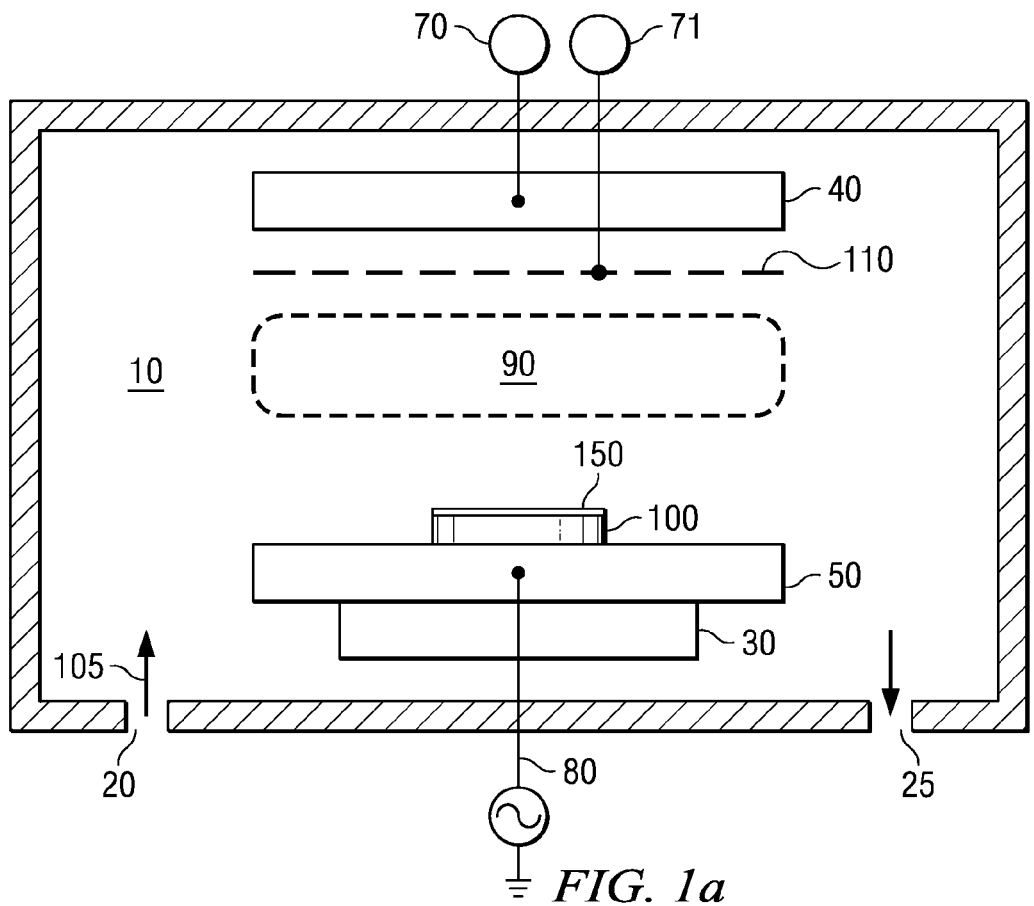

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for forming semiconductor structures using a plasma vapor deposition process. In one of its embodiments, the present invention uses an auxiliary target in a plasma vapor deposition system to improve processing time or deposition rate without significantly reducing downtime of the equipment.

Plasma vapor or sputter deposition systems are commonly used to deposit thin layers of materials in semiconductor manufacturing. One of the challenges of plasma vapor deposition (PVD) system involves improving deposition metrics such as deposition rates, directionality of deposition, uniformity of film etc., while minimizing production costs such as costs arising from replacement of parts and equipment down times. Typical PVD processes involve a compromise between the two.

In a typical plasma vapor deposition system, an inert gas such as argon is fed into the plasma vapor deposition chamber at low pressures. A voltage is applied across the chamber generating a plasma comprising ionized inert gas atoms. These ionized inert atoms are attracted or accelerated by the electric field in the chamber to strike the target electrode. The target atoms are physically dislodged from their host lattice. The free target atoms travel through the chamber some of which strike the wafer surface. The deposition rate of the film on the wafer depends on the number of incident ions, the sputter yield (number of target atoms dislodged per incident ion), and geometrical factors (for example, relationship of target relative to the wafer).

The sputter yield usually does not vary much and depends on the energy and angle of the incident ion (ionized inert gas) and the properties of the target material.

One way of increasing the deposition rates, involves increasing the number of incident ions. The number of incident ions depends on ionization efficiency of the plasma. In a typical process, many of the electrons lose their energy in non-ionizing collisions or are collected by the positive electrode (anode). Only a small fraction of the electrons in the plasma contribute to ionization of the inert atom. One way to improve ionization efficiency is by the use of a magnetic field also called magnetic sputter deposition. In this technique, a magnetic field is applied perpendicular to the electric field, for example, by placing magnets near the target surface. This causes the free electrons in the plasma to be trapped near the target surface until they collide with an inert gas atom. In addition, the neutral target atoms passing through the plasma region are more likely to be struck by an energetic particle within the plasma and become ionized. The ionized target atoms may be focused by an electric field and thus improve the directionality of the deposition. This technique is used to increase ionization efficiency, but also results in non-uniform erosion of the target material. Consequently, this results in reduced lifetime of the target material. This reduction in lifetime results in increase in equipment downtime as well as increased costs associated with inefficient use of target.

Another way of improving deposition rate is by increasing the geometrical factor of the deposition process. The target area may be increased by increasing the dimension of the target, but this also typically widens the distribution of arrival angles (angle the target ion makes with the wafer surface) of target atoms on the wafer surface. For example, a wider distribution of arrival angles may result in pinch off and improper filling of high aspect ratio features. Consequently, wider target dimensions are typically not used.

Hence, methods that simultaneously improve film deposition and production costs without compromising deposition quality or yield are needed.

In preferred embodiments, the present invention discloses the use of auxiliary targets in plasma vapor deposition systems for enhancing film deposition and/or decreasing production costs. In a particular embodiment, the auxiliary target may be used to increase the deposition rate of the plasma vapor deposition process. For example, the auxiliary target may increase the surface area of the target, increasing the sputter yield and deposition rate.

Although explained in a particular embodiment, as will be evident, concepts of the invention can be applied, however, to other techniques. For example, the current invention is applicable to other plasma processes such as sputter etching, plasma enhanced CVD.

Figure 7A:
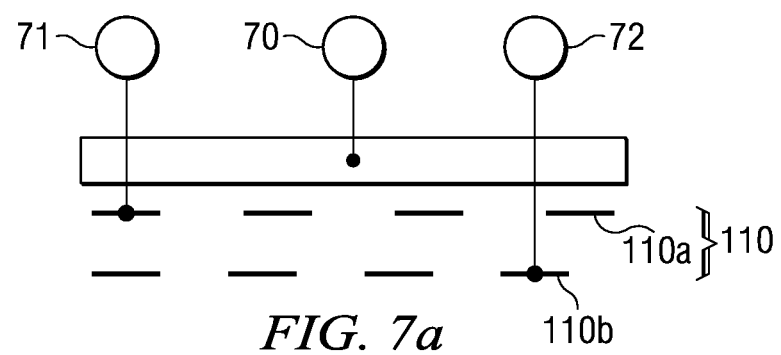
FIGS. 7a-7b illustrates the cross sectional view of the auxiliary target electrode of the plasma vapor deposition system in various embodiments of the invention, wherein the auxiliary target electrode comprise more than one independent mesh region, each region with its individual potential source.
Figure 7B:
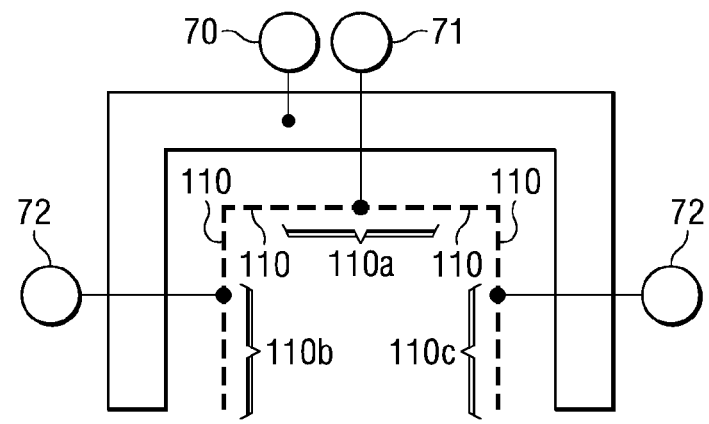
Figure 8:
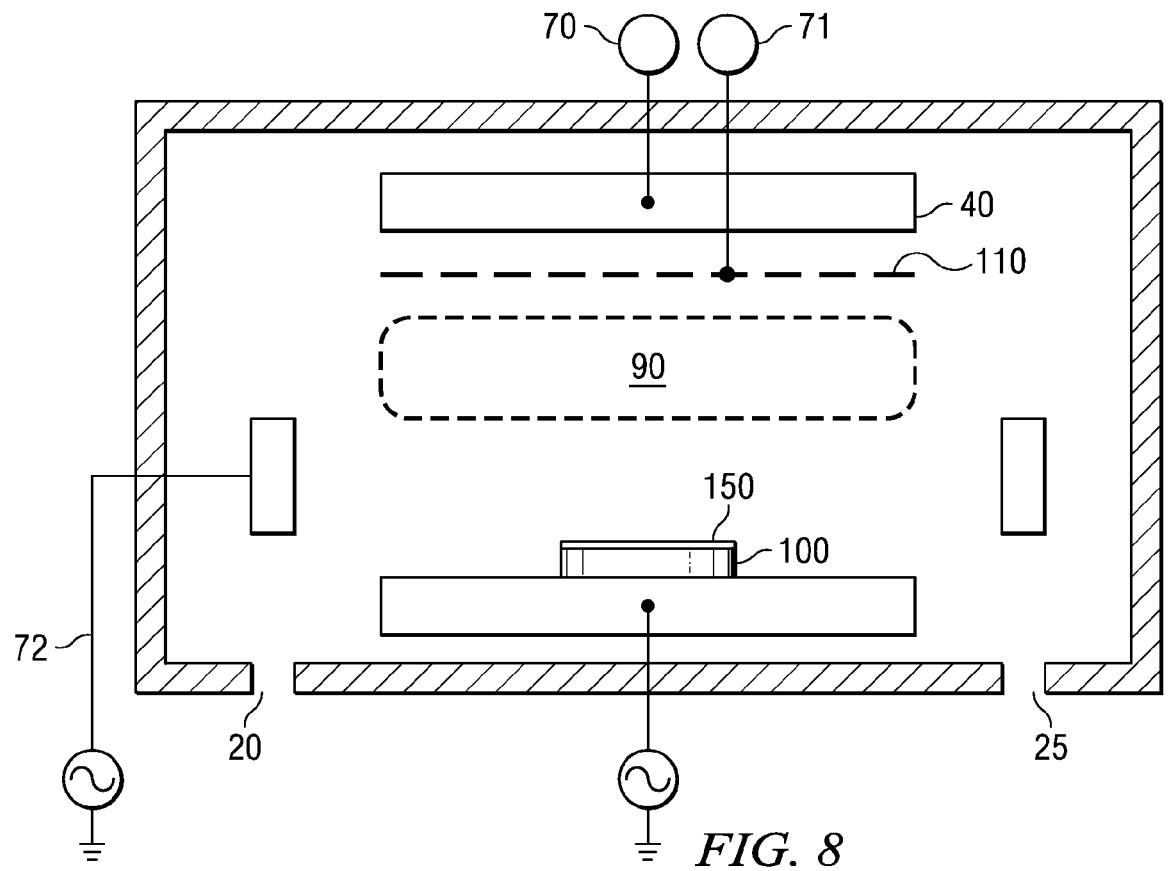
FIG. 8 illustrates an implementation of an embodiment of invention in an ionized plasma vapor deposition system.

An exemplary embodiment of the present invention is shown in FIG. 1 and various embodiments using these concepts will then be described with respect to the cross sectional views of the auxiliary target in FIGS. 2-4, FIGS. 6-7, and plasma vapor deposition systems of FIGS. 5 and 8.

FIG. 1 illustrate an embodiment of the present invention, wherein FIG. 1a illustrates a plasma vapor deposition system utilizing the current invention. The plasma vapor deposition system comprises a target electrode 40 (or cathode) connected to voltage source 70, an anode or bottom electrode 50 powered by a RF voltage bias 80, on which the wafer 100 is placed. The plasma vapor deposition chamber 10 further comprises an auxiliary target electrode 110 connected to a voltage source 71. Both the target electrode 40 and auxiliary target electrode 110 comprise a target material 120. An inert gas 105 flows into the plasma vapor deposition chamber 10 through inlet 20 and flows out through the outlet 25. The inert gas 105 forms a plasma region 90 inside the chamber forming ionized inert gas atoms 106. The bottom electrode 50 may optionally be heated by heater 30 to promote surface reactions or diffusion of deposited atoms.

Figure 1B:
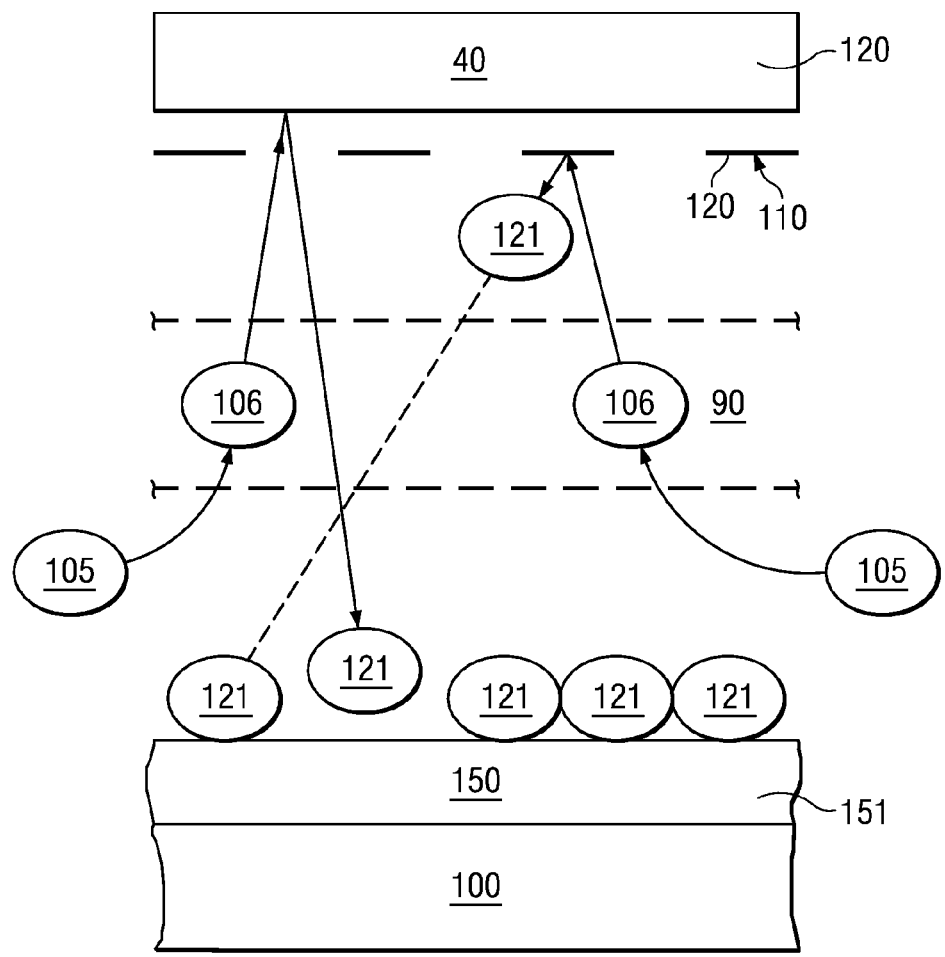

The key processes during plasma vapor deposition system are shown in FIG. 1b. The ionized inert gas atoms 106 are accelerated towards the target electrode 40 and auxiliary target electrode 110, and knocks out target material atoms 121 from the target electrode 40 and auxiliary target electrode 110. The knocked out target material atoms 121 are deposited on top of the wafer 100 to form the film 150 comprising the film material 151.

As illustrated in FIGS. 1a and 1b, the auxiliary target electrode 110 is a mesh type structure comprising the target material 120. The mesh comprises a network of nodes and connectors. The openings on the mesh allow target material atoms 121 knocked off from the target electrode 40 to pass through unimpeded. The presence of openings on the mesh structure allows for increased surface area and increases the number of collisions between ionized inert gas atoms 106 and target material atoms 121. The increased number of collisions increases the number of target material atoms 121, thus increasing the sputter yield and deposition rate of the plasma vapor deposition system.

The presence of the auxiliary target electrode 110 reduces erosion of the target electrode 40, thus increasing the life time of the target electrode 40. Further, preferably the auxiliary target electrode 110 is easily replaceable and does not require significant equipment downtime. Hence, the cost of using the plasma vapor deposition system is significantly lowered. Although not shown, the auxiliary target electrode 110 may be rotated to allow for example, uniform erosion of the target electrode 40 and the auxiliary target electrode 110.

In the preferred embodiment, the voltage sources 70 and 71 contacting the target electrode 40 and the auxiliary target electrode 110 are shorted, thus biasing them to a single potential. However, in other embodiments, the auxiliary target electrode 110 may be biased to a voltage 71 different from the voltage 70 of the target electrode 40. Similarly in some embodiments, the auxiliary target electrode 110 may be floated.

The inert gas 105 is preferably a gas such as argon, neon, xeon, helium, although any other suitable gas may be used. In various embodiments, the target material 120 and the film material 151 being coated may comprise similar composition. For example, the target material 120 many comprise metals such as aluminum, tantalum, titanium, platinum, cobalt, nickel, tungsten, molybdenum, and manganese.

However, in different embodiments, compounds may also be deposited using the plasma vapor deposition system. For example, in different embodiments the film material 151 may comprise oxides, nitrides and/or silicides of various metals and their alloys. Examples of such metals include aluminum, tantalum, titanium, platinum, cobalt, nickel, tungsten, molybdenum, manganese and combinations thereof. Compounds may be deposited, for example, by choosing a target material 120 of desired film composition. Alternately, the target material 120 and the film material 151 may comprise a different composition. In such cases, a reactive gas may be combined with the inert gas 105. The reactive gas may form the compound on the wafer 100 surface after the target material 120 is deposited on the wafer. Alternately, the reactive gas may react directly with the target electrodes 40 and 110. The deposited compound may be subsequently sputtered from the target electrodes 40 and 110. For example, in case of deposition of titanium nitride, the target material 120 comprises titanium whereas nitrogen is introduced along with the inert gas 105 and reacts to form titanium nitride either on the wafer 100 surface or on the target surface. Similarly, other films such as metal oxides (e.g. TiO2) may be deposited by reactive sputtering.

In some embodiments, the film may be formed after deposition. For example, silicides may be grown by sputtering of a metal on to the silicon surface, the silicon atoms further reacting with the metal atoms forming a silicide film. Although in the preferred embodiment, the target electrode 40 and auxiliary target electrode 110 comprise the same target material 120, in other embodiments they may comprise different materials.

Finally, a preferred embodiment of using the designed sputter or plasma vapor deposition system will now be discussed. Referring to FIG. 1a, for a 300 mm wafer tool, the target electrode 40 is about 16" to about 20" wide. The bottom electrode 50 may similarly be about 12" to about 20" wide. The auxiliary target electrode 110 may similarly be about 16" to about 20" wide. The distance between the target electrode 40 and the auxiliary target electrode 110 may about 1" to about 15". The deposition may be performed for example by flowing argon through inlet 20 at about 10 sccm to about 1000 sccm. The deposition may be powered by keeping the target electrode 40 at about 500 W to about 6000 W, the auxiliary target electrode 110 shorted to the target electrode. The bottom electrode 50 may be powered by a RF bias of about 500 W to about 2000 W.

Embodiments of the top cross sectional view of the auxiliary target electrode 110 is illustrated in FIG. 2. As discussed earlier, the auxiliary target electrode 110 comprises a mesh comprising a network of nodes and connectors. The connectors may be curve elements of any shape. The embodiment of FIG. 2 display connectors with linear curve elements. For example in FIG. 2a, the connectors 600-608 linearly connect nodes 500-507. The connector density and connector width may be suitably selected to maximize deposition rate. For example, the connector width and permeability of the auxiliary target electrode 110 to target material atoms 121 may be co-optimized to enhance, for example, the deposition rate.

Figure 2A:
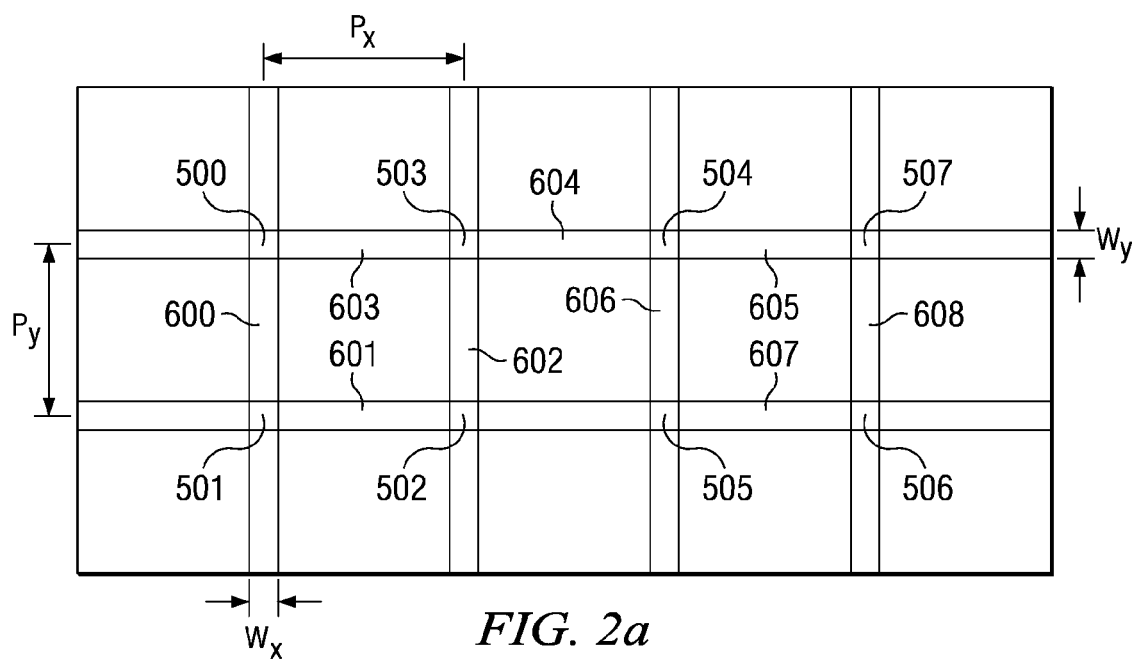
FIGS. 2a-2f illustrates the top cross sectional view of the auxiliary target electrode of the plasma vapor deposition system in various embodiments of the invention, wherein the embodiments illustrate mesh designs with different geometric features.

FIGS. 2a-2e describe embodiments of the auxiliary target material illustrating various combinations of connectors and node elements. In particular, geometrical factors such as connector width and connector density are varied in these embodiments. FIG. 2a shows the auxiliary target electrode 110 with a constant connector density and connector width. For example, the distance between the center of the connectors in a particular direction or connector pitch (px, py) between all the connectors is constant. Similarly, the connector width in a particular direction (wx, wy) is also constant. Further, in FIG. 2a, the connector pitch and connector width in both directions is about equal (px=py; and wx=wy).

Figure 2B:
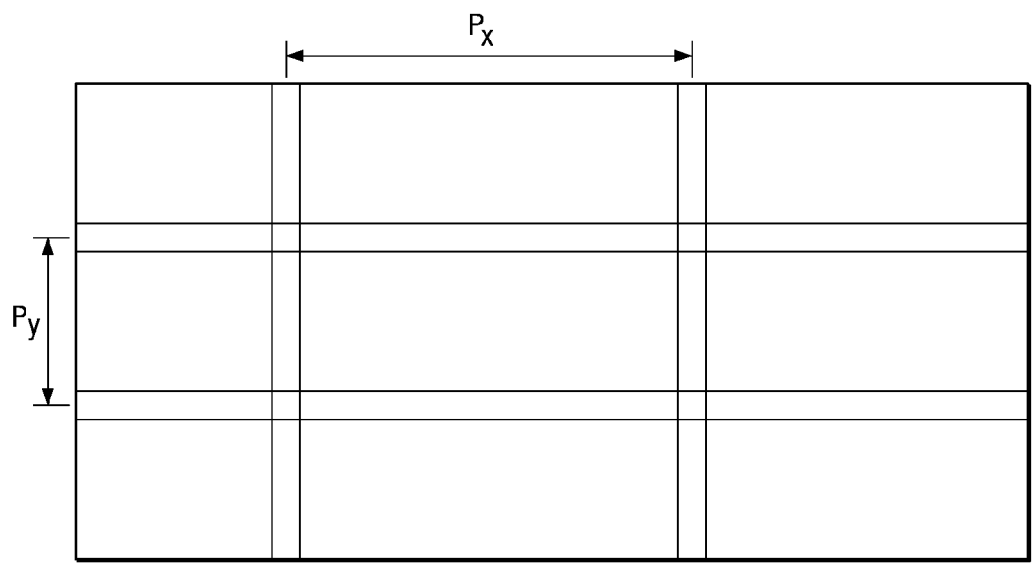
Figure 2C:
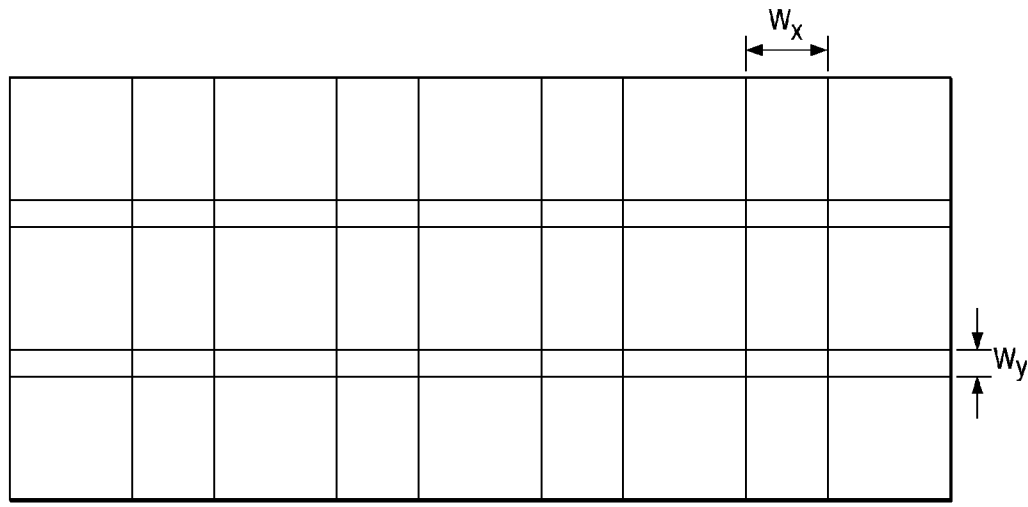
Figure 2D:
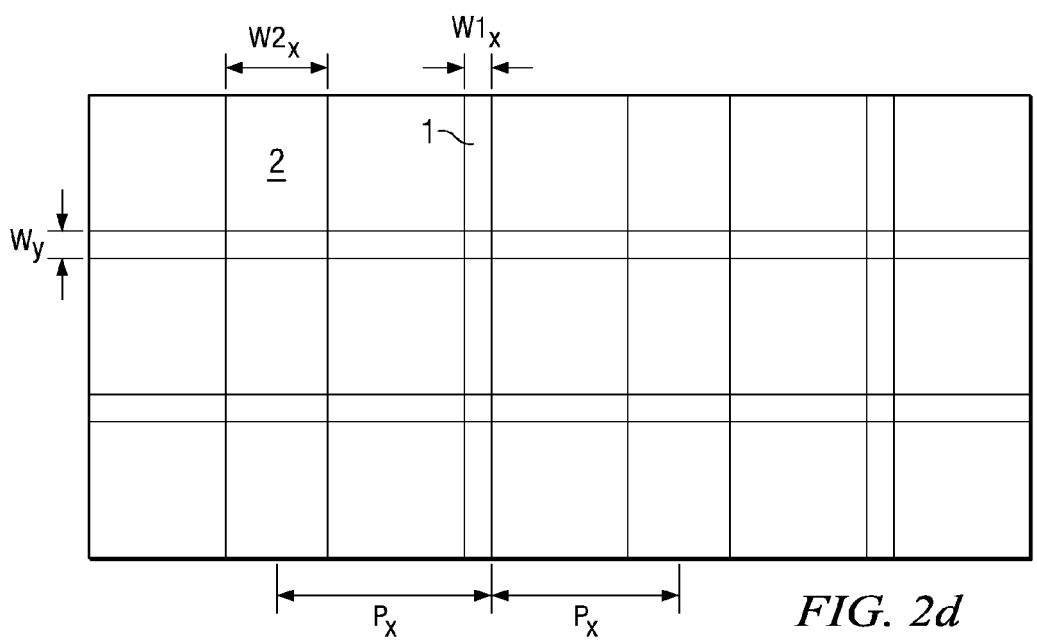

In other embodiments, variants are possible with different connector pitch and connector widths. FIG. 2b illustrates another embodiment, wherein the connector pitch in both directions are different i.e. px≠py. FIG. 2c illustrates a different embodiment of the auxiliary target electrode 110, wherein the connector width is different between the two directions or wx≠wy. Further, the connectors may comprise different widths in a particular direction. An example of such an embodiment is shown in FIG. 2d, wherein neighboring connectors 1 and 2 have different width w1x and w2x or w1x≠w2x, although the connector pitch is constant between the connectors.

Figure 2E:
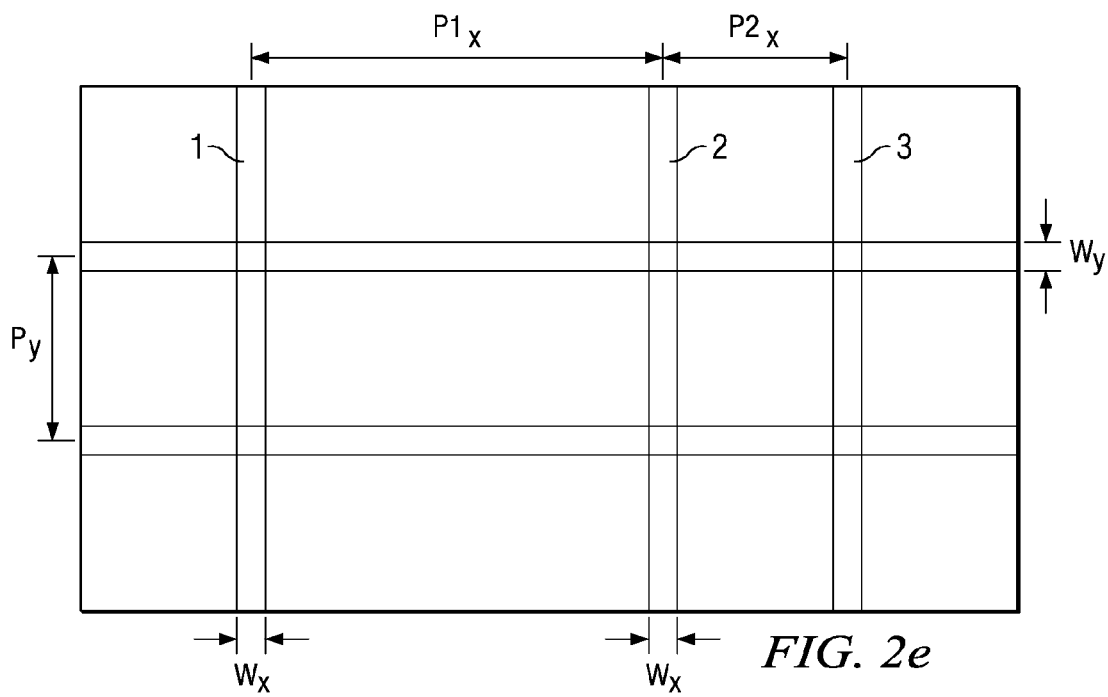

In other embodiments, the connector pitch may also vary as shown in FIG. 2e. The connector pitch p1x between the connectors 1 and 2, and the connector pitch p2x between the connectors 2 and 3 is different or p1x≠p2x. Although in this case, the connector widths wx and wy are constant, in other embodiments these may also be varied. Similarly, the connector pitch py in FIG. 2e is constant, but may vary in other embodiments.

Figure 2F:
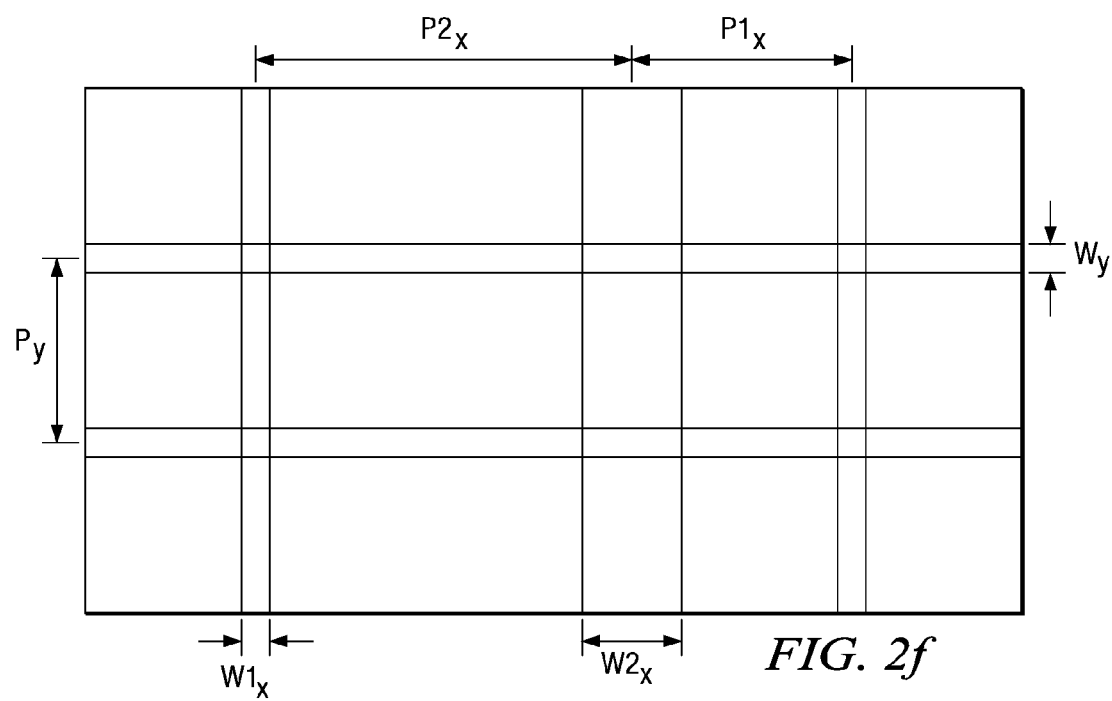

FIG. 2f illustrates another embodiment of the auxiliary target electrode 110 in which both the width and pitch are varied together. The widths w1x and w2x are different or w1x≠w2x. Similarly in FIG. 2f, the connector pitch is different across the auxiliary target electrode 110 or p1x≠p2x. Although, in the current examples, only two connector widths or two connector pitches are shown, in various embodiments multiple connectors with multiple connector widths and connector pitches are possible.

In various embodiments, the connector width on the auxiliary target electrode 110 could range from about 0.5 mm to about 5 mm. Further, the connector density (number of connectors per unit length) could be about 0.1 to about 10/cm or any other suitable density.

In the previously described embodiments, the idea of multiple connector pitches and connector widths of the auxiliary target electrode was illustrated for a mesh comprising linear connectors. As will be described in various embodiments in FIG. 3, the connectors could be non-linear. In-fact, in different embodiments the connectors could be any curve or any continuous segment. Similarly, these concepts can be extended to patterns formed by these connectors. For example, the auxiliary target electrode 110 may contain a network of connectors, wherein at least a portion of the connectors form a pattern. The pattern may comprise any suitable shape. For example, the network of connectors may form a pattern such as a rectangle, square, diamond, triangle, circle, and/or oval.

FIGS. 3a-3d describe embodiments of the auxiliary target electrode 110 that illustrate specific examples of patterns formed by the network of connectors. Although, in embodiments discussed here, the network of connectors in the auxiliary target electrode 110 form a pattern or design, in various embodiments such a design or pattern may not be apparent. A truly random arrangement of connectors is also possible in different embodiments.

Figure 3A:
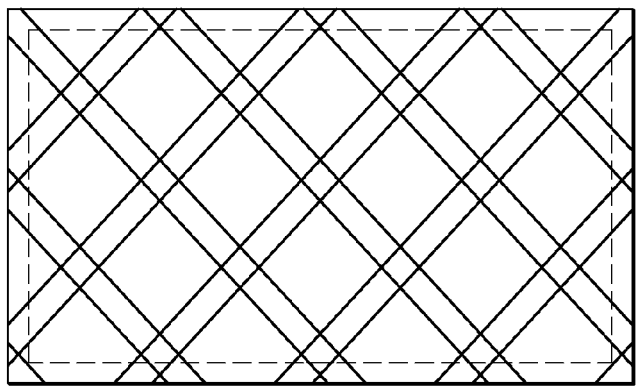
FIGS. 3a-3d illustrates the top cross sectional view of the auxiliary target electrode of the plasma vapor deposition system in various embodiments of the present invention, wherein the embodiments illustrate mesh designs with different geometric patterns.

Referring to FIG. 3a, auxiliary target electrode 110 is illustrated wherein the network of connectors form a pattern comprising a diamond or diagonal design.

Figure 3B:
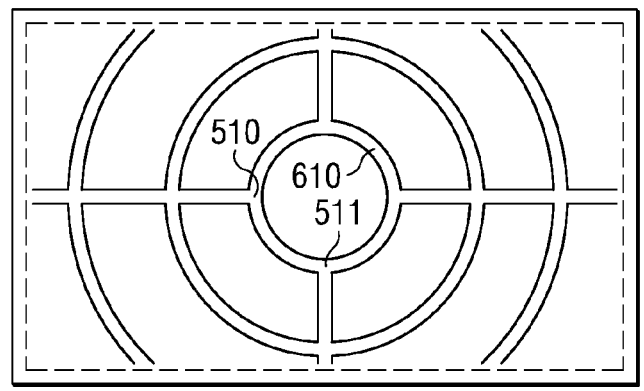

FIG. 3b illustrates an embodiment in which the mesh forming the auxiliary target electrode 110 includes circular shapes. It is specifically noted, that the connectors in this example comprise an arc. For example, nodes 510 and 511 in FIG. 3b are connected by a connector 610 comprising an arc curve element. In other embodiments, this curve element can also be an ellipse, parabola or any other suitable curve.

Figure 3C:
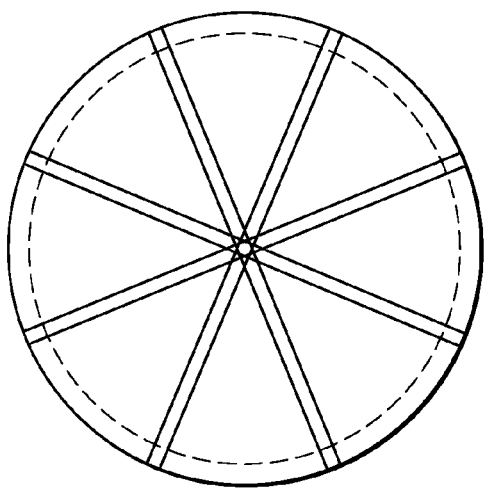
Figure 3D:
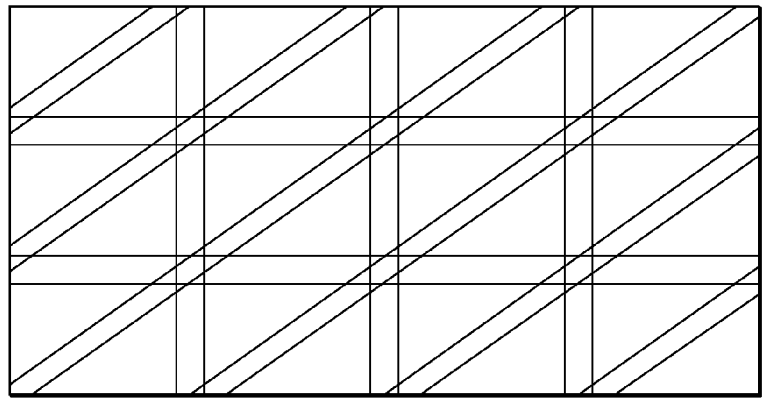

FIG. 3c illustrates an embodiment wherein the auxiliary target electrode 110 comprises a mesh that includes an axial or radial design. Similarly, a triangular shaped mesh forms a portion of the auxiliary target electrode 110 in FIG. 3d. It should be noted that other suitable designs or patterns may be part of the auxiliary target electrode 110. In different embodiments, different designs or patterns may be all part of a single auxiliary target electrode 110.

Figure 4A:
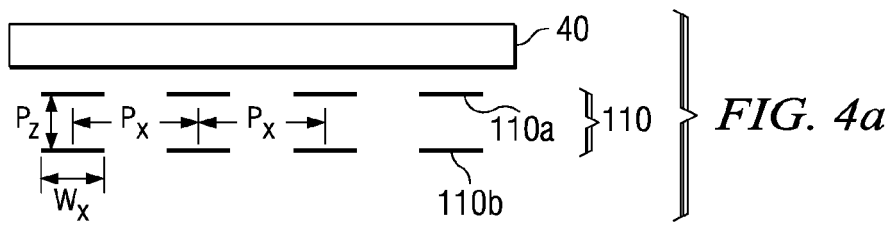
FIGS. 4a-4e illustrates the top cross sectional view of the auxiliary target electrode of the plasma vapor deposition system in different embodiments of the present invention, wherein the different embodiments illustrate the auxiliary target electrode comprising stacked mesh layers.
Figure 4B:
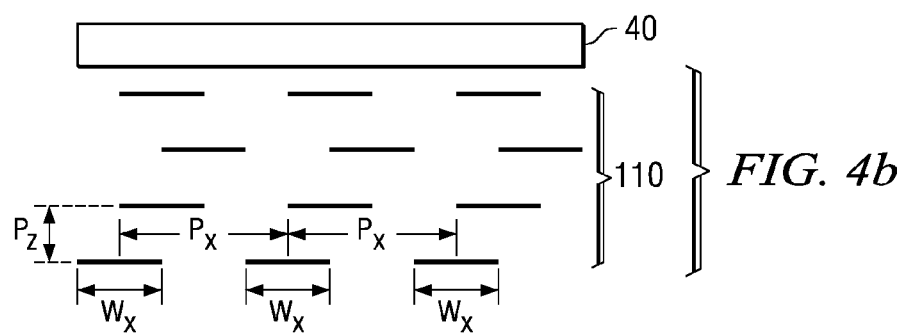
Figure 4C:
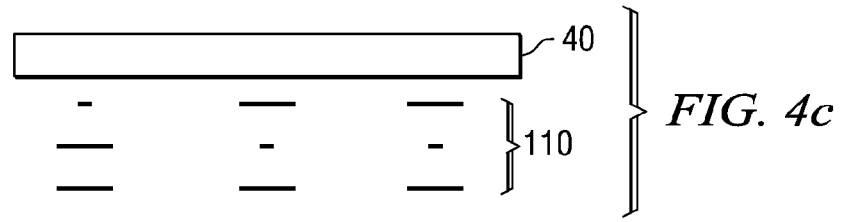
Figure 4D:
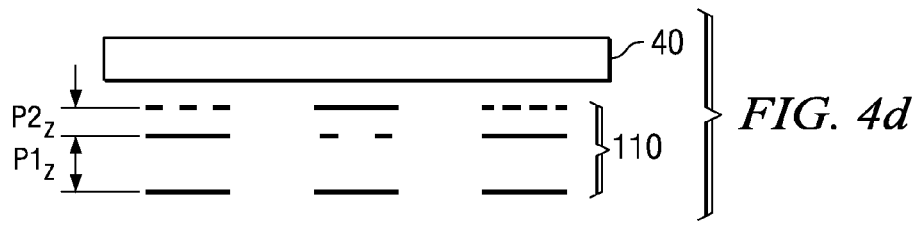

The auxiliary target electrode 110 discussed so far comprised only a single layer of mesh or network of connectors. However, in various embodiments the auxiliary target electrode 110 may comprise a plurality of layers stacked over each other. FIG. 4 illustrate different embodiments, wherein the auxiliary target electrode 110 comprises multiple layers. As shown in FIG. 4a, the auxiliary target electrode 110 comprises at least two layers 110a and 110b, wherein the distance between the layers is shown as pz. The connectors within a layer are separately by, for example, constant connector pitches px and py (not shown) and connector widths wx and wy (not shown). In different embodiments, these layers may be staggered differently. An example of such a staggered structure is shown in FIG. 4b. As discussed in various embodiments for a single layer, the plurality of stacked layers may have variations in connector pitch and connector width in any of the three directions. Examples of embodiments with varying connector pitch and connector width are shown in FIGS. 4c and 4d.

Figure 4E:
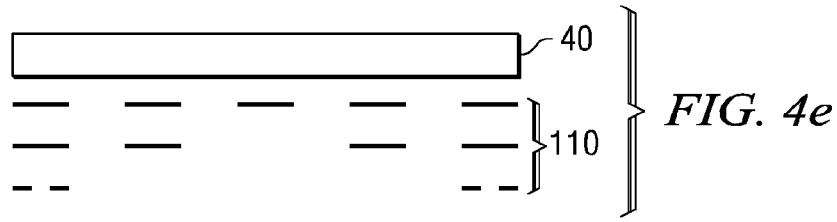

Finally, the connector density (number of connectors in a direction normal to the plane of the auxiliary target electrode 110) may also vary in different embodiments. An example of such an embodiment is shown in FIG. 4e. In this specific example, the connector density is higher towards the edge of the auxiliary target 110 than towards the center. Such a design may be beneficial, for example, to optimize or minimize uneven erosion of target electrode 40. Regions that are likely to be eroded first may be selectively compensated using the auxiliary target electrode 110. Such regions may be easily identified by for example looking at experimental results or modeling the field lines (magnetic and electrical) in the plasma vapor deposition chamber 10 during operation.

Although, different embodiment described the concepts of connector pitch, connector width, and connector density were described in a Cartesian coordinate system, these concepts can be extended or modified to account for variations in the geometry of the auxiliary target electrode 110. For example, in different embodiments the auxiliary target electrode 110 may be cylindrical, or spherical rather than planar.

Figure 5A:
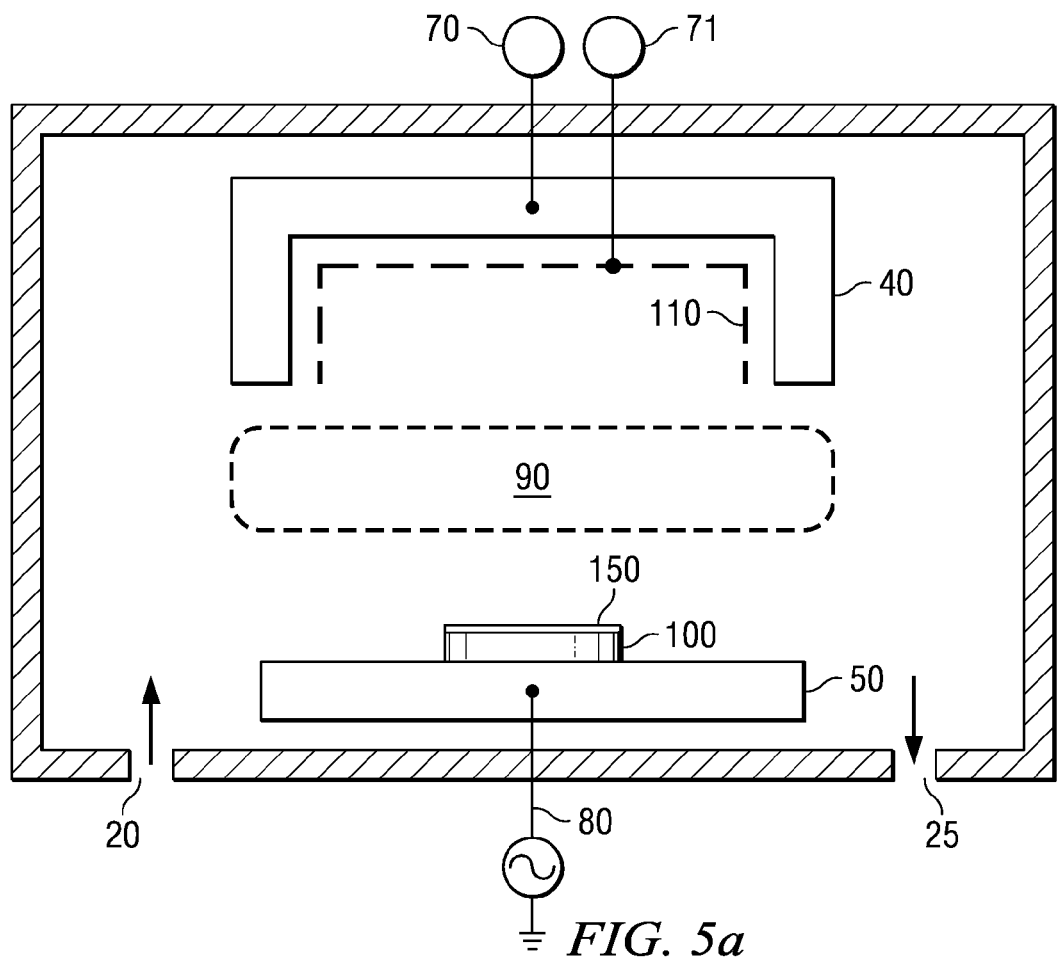
Figure 5B:
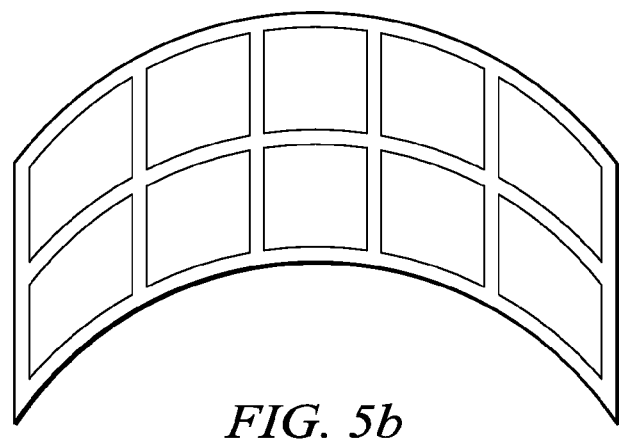

The auxiliary target electrode 110 may be used in different types of plasma vapor deposition systems. One particular example includes a system that uses concave target electrode 40. In such systems, the shape and design of the auxiliary target electrode 110 may be suitably modified. FIG. 5a illustrates an embodiment of the current invention using a concave electrode plasma vapor deposition system. FIG. 5b illustrates the top cross sectional view of the auxiliary target electrode 110.

Figure 6A:
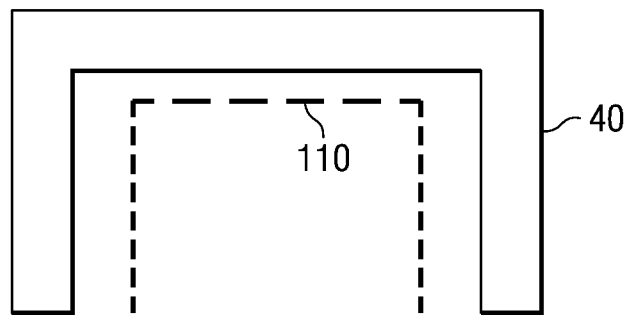
FIGS. 6a-6b illustrates the cross sectional view of the auxiliary target electrode of the plasma vapor deposition system using a concave target in various embodiments of the invention, wherein the different embodiments illustrate different formations of the mesh design.
Figure 6B:
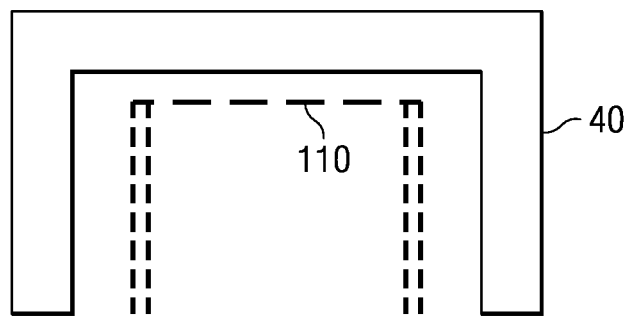

In various embodiments, the auxiliary target electrode 110 as discussed earlier for a planar target electrode 40, can involve various modifications in connector density, connector pitch and connector width. For example, in various embodiments, the mesh around the corner of the auxiliary target electrode 110 may be different than the center of the auxiliary target electrode 110. This is because, the edges typically show increased target erosion and can thus be compensated appropriately. An example of such an embodiment is shown in FIG. 6a, wherein the edges have smaller connector widths and smaller connector pitch. A different embodiment of this design is shown in FIG. 6b, where the edge regions have a different line density (number of layer stacked) than the center regions. Although not shown, various modifications to the design of the auxiliary target electrode 110 may be possible to optimize process parameters such as deposition rate, target erosion and target lifetime.

As discussed before, the auxiliary target electrode 110 may be electrically shorted to the target electrode 40, floated or connected to an independent voltage source. In different embodiments, the auxiliary target electrode 110 may comprise electrically independent regions that may be independently connected. FIG. 7a illustrates an embodiment in which the auxiliary target electrode 110 comprises two stacked layer 110a and 110b. The layers 110a and 110b are not electrically connected and instead connect to independent voltage sources 71 and 72. In some embodiments, only some of these electrically isolated regions may be independently shorted with the target electrode 40 or floated. A different embodiment of the current invention is illustrated in FIG. 7b, wherein the auxiliary target electrode 110 comprises electrically isolated regions 110a, 110b and 110c. Each of these regions may be independently controlled with a different voltage source. For example, in FIG. 7b the regions 110b and 110c are connected to a voltage source 72, whereas the region 110a is connected to a different voltage source 71.

The current invention may be beneficially coupled with other concepts to increase the efficiency of the manufacturing process. For example, the directionality of the plasma vapor deposition system may be improved by using only the ionized target material atoms 121, for example, by accelerating them in an electric field. However, in a typical plasma vapor deposition technique only a small fraction of the target material atoms 121 are ionized (less than 10%). Modifications to plasma vapor deposition systems are possible to increase the directionality by increasing the ionization of the target material atoms 121.

One way to improve ionization efficiency is the use of a RF bias in the plasma vapor deposition chamber 10. Such additions will result in a multiplicative effect (at least more than additive) on the deposition rate of the plasma vapor deposition system. An example of such a RF coupled ionized plasma vapor deposition system is shown in FIG. 8. The additional RF electrodes 72 help to ionize the target material atoms 121 and increase their directionality and enhance deposition rate. Consequently, coverage of features with high aspect ratio may be further improved.

It will be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:
1. A plasma vapor deposition system comprising:
a top target electrode disposed in a plasma chamber, wherein the top target electrode comprises a first target material to be deposited, wherein the top target electrode comprises a central region surrounded by a peripheral region;

a bottom electrode disposed in the plasma chamber and spaced below the top target electrode;
a workpiece holder disposed in the plasma chamber between the top target electrode and the bottom electrode; and
at least one auxiliary target electrode disposed in the plasma chamber disposed between the top target electrode and the workpiece holder, the auxiliary target electrode comprising a mesh with a plurality of openings in a plane of the auxiliary target electrode parallel to a major surface of the bottom electrode, wherein the least one auxiliary target electrode comprises a second target material to be deposited, wherein the auxiliary target electrode has a central portion disposed below and overlapping with the central region of the top target electrode and an edge portion disposed below and overlapping with the peripheral region of the top target electrode, wherein a thickness of the auxiliary target electrode in the edge portion is different from a thickness of the auxiliary target electrode in the central portion, wherein the mesh comprises a first layer having first set of openings and a second layer having second set of openings, wherein the second set of openings comprise a central opening having a larger diameter than a diameter of surrounding openings of the second set of openings, wherein the first layer and the second layer are parallel to each other, and wherein the thickness is measured along a direction from the top target electrode to the bottom electrode.

2. The plasma vapor deposition system of claim 1, wherein the top target electrode and the auxiliary target electrode comprise materials of different composition.

3. The plasma vapor deposition system of claim 1, wherein the top target electrode comprises a material selected from the group consisting of aluminum, tantalum, titanium, platinum, cobalt, nickel, tungsten, molybdenum, manganese, and their oxides, nitrides, silicides, and combinations thereof.

4. The plasma vapor deposition system of claim 1, wherein the auxiliary target electrode comprises a material selected from the group consisting of aluminum, tantalum, titanium, platinum, cobalt, nickel, tungsten, molybdenum, manganese, and their oxides, nitrides, silicides, and combinations thereof.

5. The plasma vapor deposition system of claim 1, wherein the bottom electrode is connected to a first voltage source, the top target electrode is connected to a second voltage source and the auxiliary target electrode is connected to a third voltage source.

6. The plasma vapor deposition system of claim 1, wherein the auxiliary target electrode comprises electrically isolated regions, wherein each region is independently connected to a different voltage source.

7. The plasma vapor deposition system of claim 1, wherein the mesh further comprises a network of connectors, wherein each connector comprises a curve element.

8. A method of coating a film, using the plasma vapor deposition system claimed in claim 1.

9. A method of fabricating an integrated circuit, the method comprises:
placing a workpiece over a bottom electrode, the bottom electrode disposed in a plasma chamber, the plasma chamber further comprising a top target electrode and at least one auxiliary target electrode comprising a mesh with a plurality of openings in a plane of the auxiliary target electrode parallel to a major surface of the bottom electrode, wherein the top target electrode comprises a first target material to be deposited, wherein the top target electrode comprises a central region surrounded by a peripheral region, wherein the least one auxiliary target electrode comprises a second target material to be deposited, wherein the least one auxiliary target electrode has a central portion disposed below and overlapping with the central region of the top target electrode and an edge portion disposed below and overlapping with the peripheral region of the top target electrode, wherein a thickness of the least one auxiliary target electrode in the edge portion is different from a thickness of the least one auxiliary target electrode in the central portion, wherein the mesh comprises a first layer having first set of openings and a second layer having second set of openings, wherein the second set of openings comprise a central opening having a larger diameter than a diameter of surrounding openings of the second set of openings, wherein the first layer is parallel to the second layer, and wherein the thickness is measured along a direction from the top target electrode to the bottom electrode;
flowing a gas in to the plasma chamber; and
powering the top target electrode, the bottom electrode and the auxiliary target electrode such that at least some of the gas is ionized, wherein ionized gas atoms sputter target atoms out off the top target electrode and the auxiliary target electrode so that at least a portion of the sputtered target atoms are deposited over the workpiece.

10. The method of claim 9, wherein the workpiece comprises a silicon wafer.

11. The method of claim 9, wherein the gas comprises an inert gas.

12. The method of claim 11, wherein the gas further comprises at least one reactive gas.

13. The method of claim 9, wherein the bottom electrode is connected to a first voltage source, the top target electrode is connected to a second voltage source and the auxiliary target electrode is connected to a third voltage source.

14. The method of claim 9, wherein the auxiliary target electrode comprises electrically isolated regions, wherein each region is independently connected to a different voltage source.

15. The method of claim 9, wherein the mesh further comprises a network of connectors, wherein each connector comprises a curve element.

16. The method of claim 15, wherein the curve elements have a plurality of widths.

17. The method of claim 15, wherein a distance between the connectors is different within the mesh.

18. The method of claim 9, wherein the auxiliary target electrode comprises stacked mesh layers.

19. The method of claim 18, wherein a number of mesh layers in the stacked mesh layers varies within the auxiliary target electrode.

20. The method of claim 18, wherein the mesh layers are staggered between each layer.

21. A method of fabricating an integrated circuit, the method comprises:
placing a workpiece over a bottom electrode, the bottom electrode disposed in a chamber, the chamber further comprising a concave shaped top target electrode, and at least one auxiliary target electrode, the auxiliary target electrode comprising a network of connectors forming a mesh, wherein the mesh comprises a first layer having first set of openings and a second layer having second set of openings, wherein the second set of openings comprise a central opening having a larger diameter than a diameter of surrounding openings of the second set of openings, wherein each connector comprises a curve element, wherein the top target electrode comprises a first target material to be deposited, wherein the top target electrode comprises a central region surrounded by a peripheral region, wherein the least one auxiliary target electrode comprises a second target material to be deposited, wherein the least one auxiliary target electrode has a central portion disposed below and overlapping with the central region of the top target electrode and an edge portion disposed below and overlapping with the peripheral region of the top target electrode, wherein the edge portion of the least one auxiliary target electrode is coupled to a different voltage potential than the central portion of the least one auxiliary target electrode, wherein a thickness of the least one auxiliary target electrode in the edge portion is different from a thickness of the least one auxiliary target electrode in the central portion, and wherein the thickness is measured along a direction from the top target electrode to the bottom electrode;

flowing a gas in to the chamber; and powering the top target electrode, the bottom electrode and the auxiliary target electrode such that at least some of the gas is ionized, wherein ionized gas atoms sputter target atoms out off the top target electrode and the auxiliary target electrode so that at least a portion of the sputtered target atoms are deposited over the workpiece.

22. The method of claim 21, wherein the auxiliary target electrode are shorted with the top target electrode.

23. The method of claim 21, wherein the auxiliary target electrode comprises electrically isolated regions, each region independently connected to a different voltage source.

24. The method of claim 21, wherein the curve elements have a plurality of widths.

25. The method of claim 21, wherein a distance between the connectors is different within the mesh.

26. The method of claim 21, wherein the connectors comprise at least one curve selected from the group of curves consisting of line, arc, ellipse, and parabola.

27. The method of claim 21, wherein the mesh comprises at least one pattern selected from the group of patterns consisting of rectangle, square, diamond, triangle, circle, oval, or radial.

28. The method of claim 21, wherein the auxiliary target electrode comprises stacked mesh layers.

29. The method of claim 28, wherein a number of mesh layers in the stacked mesh layers varies within the auxiliary target electrode.

30. The method of claim 28, wherein the mesh layers are staggered between each layer.

31. The method of claim 21, wherein the deposition fills a deep via on a semiconductor device.

32. The method of claim 21, wherein the deposition forms a metal line on a semiconductor device.

33. The plasma vapor deposition system of claim 1, wherein the top target electrode and the auxiliary target electrode comprise materials of same composition.

34. The plasma vapor deposition system of claim 1, wherein the least one auxiliary target electrode comprises a 'U-shaped' electrode, wherein a bottom surface of the 'U-shaped' electrode comprises the central portion, and wherein sidewalls of the 'U-shaped' electrode comprises the edge portion.

35. The plasma vapor deposition system of claim 34, wherein the auxiliary target electrode comprises a network of connectors forming a mesh, wherein a connector pitch of the sidewalls is smaller than a connector pitch of the bottom surface.

36. The plasma vapor deposition system of claim 35, wherein the sidewalls have a smaller connector width than a connector width of the bottom surface.

37. The plasma vapor deposition system of claim 34, wherein a portion of the auxiliary target electrode along the sidewalls has more number of mesh layers than a portion of the auxiliary target electrode along the bottom surface.

38. The plasma vapor deposition system of claim 1, wherein the auxiliary target electrode comprises layers of a mesh, and wherein the number of layers of the mesh in the central portion is less than the number of layers of the mesh in the edge portion.

39. The plasma vapor deposition system of claim 1, wherein an average thickness of the auxiliary target electrode within an area enclosed by the edge portion is different from an average thickness of the auxiliary target electrode within an area enclosed by the central portion.

40. The method of claim 9, wherein an average thickness of the least one auxiliary target electrode within an area enclosed by the edge portion is different from a thickness of the least one auxiliary target electrode within an area enclosed by the central portion.

41. The method of claim 21, wherein an average thickness of the least one auxiliary target electrode within an area enclosed by the edge portion is different from an average thickness of the least one auxiliary target electrode within an area enclosed by the central portion.

42. The plasma vapor deposition system of claim 1, wherein a major surface of the auxiliary target electrode facing away from the top target electrode is non-planar because of the variation in thickness of the auxiliary target electrode.

43. The plasma vapor deposition system of claim 1, wherein the mesh further comprises a third layer having a third set of openings, the third layer being parallel to the first and the second layers, and wherein the third set of openings comprise a central opening having a larger diameter than a diameter of surrounding openings of the third set of openings.

44. The method of claim 9, wherein a major surface of the auxiliary target electrode facing away from the top target electrode is non-planar because of the variation in thickness of the auxiliary target electrode.

45. The method of claim 9, wherein the mesh further comprises a third layer having a third set of openings, the third layer being parallel to the first and the second layers, and wherein the third set of openings comprise a central opening having a larger diameter than a diameter of surrounding openings of the third set of openings.

46. The method of claim 21, wherein the mesh further comprises a third layer having a third set of openings, the third layer being parallel to the first and the second layers, and wherein the third set of openings comprise a central opening having a larger diameter than a diameter of surrounding openings of the third set of openings.

* * * * *